United States Patent [19]
Kerber

[11] Patent Number: 6,157,060
[45] Date of Patent: Dec. 5, 2000

[54] HIGH DENSITY INTEGRATED SEMICONDUCTOR MEMORY AND METHOD FOR PRODUCING THE MEMORY

[75] Inventor: Martin Kerber, München, Germany

[73] Assignee: Siemens Aktiengesellschaft, Munich, Germany

[21] Appl. No.: 09/111,120

[22] Filed: Jul. 6, 1998

Related U.S. Application Data

[63] Continuation of application No. PCT/DE96/02386, Dec. 11, 1996.

[30] Foreign Application Priority Data

Jan. 5, 1996 [DE] Germany ............... 196 00 307

[51] Int. Cl.$^7$ ............................................. H01L 29/788
[52] U.S. Cl. ..................... 257/316; 257/315; 257/319; 257/623
[58] Field of Search .................. 257/314, 315, 257/316, 317, 319, 623

[56] References Cited

U.S. PATENT DOCUMENTS

| | | | |
|---|---|---|---|
| 4,799,090 | 1/1989 | Nishizawa | 257/106 |
| 5,017,977 | 5/1991 | Richardson | 257/316 |
| 5,053,842 | 10/1991 | Kojima | 257/316 |
| 5,350,937 | 9/1994 | Yamazaki et al. | 257/316 |
| 5,382,540 | 1/1995 | Sharma et al. | 438/259 |
| 5,414,287 | 5/1995 | Hong | 257/316 |
| 5,432,739 | 7/1995 | Pein | 365/185.11 |
| 5,460,988 | 10/1995 | Hong | 438/259 |
| 5,508,544 | 4/1996 | Shah | 257/316 |

FOREIGN PATENT DOCUMENTS

| | | |
|---|---|---|
| 0 681 333 A1 | 11/1995 | European Pat. Off. . |
| 195 26 011 C1 | 11/1996 | Germany . |
| 4-155870 | 5/1992 | Japan . |
| 7-235649 | 9/1995 | Japan . |

OTHER PUBLICATIONS

"Performance of the 3–D Pencil Flash EPROM Cell and Memory Array" (Pein et al.), IEEE Transactions on Electron Devices, vol. 42, No. 11, Nov. 1995, pp. 1982–1991.

"A 3–D Sidewall Flash EPROM Cell and Memory Array" (Pein et al.), IEEE Electron Device Letters, vol. 14, No. 8, Aug. 1993, pp. 415–417.

*Primary Examiner*—Jerome Jackson, Jr.
*Assistant Examiner*—George C. Eckert, II
*Attorney, Agent, or Firm*—Herbert L. Lerner; Laurence A. Greenberg; Werner H. Stemer

[57] ABSTRACT

The high density integrated semiconductor memory has an EPROM cell in the form of a pillar. The cell has a floating gate and a control gate. The EPROM cell is dimensioned so thin that it is fully depleted. The control gate of the preferred split gate flash EPROM cell or of the dual gate flash EPROM cell is composed of p$^+$-doped semiconductor material, so that the fully depleted cylinders exhibit superior lower threshold behavior.

2 Claims, 6 Drawing Sheets

HIGH DENSITY INTEGRATED SEMICONDUCTOR MEMORY AND METHOD FOR PRODUCING THE MEMORY

CROSS-REFERENCE TO RELATED APPLICATION

This is a continuation of copending international application PCT/DE96/02386, filed on Dec. 11, 1996, which designated the United States.

BACKGROUND OF THE INVENTION

Field of the Invention

The invention relates to a high density integrated semiconductor memory with an n-channel-EPROM cell in the form of a pillar. An $n^+$-doped source region runs along the base of the pillar and an $n^+$-doped drain-region is arranged on the pillar. The pillar also has an $n^+$-doped floating gate and a control gate. The lateral measurements of the pillar are chosen such that the pillar in a potential free state of the n-channel-EPROM cell is fully depleted of free charge carriers. The floating gate is disposed on the side walls of the pillar and encloses the pillar. The control-gate encloses the pillar and the floating-gate and it is disposed on the side walls of the pillar with an intermediate insulator layer at least in one subregion. The invention furthermore relates to a method for producing such a semiconductor memory.

In high density integrated semiconductor memories, particularly in electrically programmable, non-volatile memories (EPROMs), the integration density is limited, inter alia, by the structural resolution of photolithography. Minimum cell areas of about $7*F^2$ have already been produced by means of lateral integration of stacked gate flash cells in a NAND arrangement. F in this case indicates the minimum length which can be achieved by photolithography—referred to as the minimum feature size.

Greater integration density can be achieved with a vertical design of the EPROM cells, which are transistors in the form of cylinders or pillars. Stacked gate flash cells with a cell area of about $4.4*F^2$ can be produced using 1 µm cylinders. Smaller cell areas cannot be produced using this technique, since the cylinders are already at the limit of structural fineness of the photographic technique. In addition, if the cylinder diameter is reduced further, these cylinders are fully depleted, so that the cell transistors no longer switch off in the discharged state. This effect is comparable to the over-erase problem with stacked gate memories.

A highly integrated semiconductor memory of the above-mentioned type is known from U.S. Pat. No. 5,414,287 to Hong. That semiconductor memory is produced by a method in which on a $p^+$-doped substrate etching masks are produced, an anisotropic etching for the production of pillars is carried out, an $n^{30}$-implantation in the back-etched substrate regions is carried out, an oxide is grown on the pillars and the surfaces therebetween, $n^+$-doped polysilicon for the production of the floating gate is deposited and removed in the area of the surfaces located between the pillars. The removal is effected by anisotropic etching. An interpolydielectric is deposited on the $n^+$-doped polysilicon, an n-doped polysilicon layer is deposited for forming a control gate, the second polysilicon layer is etched isotropically, so that the second polysilicon layer still completely encloses the first polysilicon layer, the original etching mask is removed at the pillar tips, and the contacts are produced there.

A high density integrated semiconductor memory with a pillar structure is know from H. Pein and J. D. Plum, *Performance of the 3-D Pencil Flasch EPROM Cell and Memory Array*, U.S.-Z.: IEEE TRANSACTIONS ON ELECTRON DEVICES, Vol. 42, No. Nov. 11, 1995, pages 1982–1991. There, the pillar is designed such that it is fully depleted of charge carriers.

SUMMARY OF THE INVENTION

It is accordingly an object of the invention to provide a high density integrated semiconductor memory and a production method, which overcomes the above-mentioned disadvantages of the prior art devices and methods of this general type and which operates reliably even with sub-lithographic dimensions.

With the foregoing and other objects in view there is provided, in accordance with the invention, a highly integrated semiconductor memory, comprising:

an n-channel-EPROM cell in the form of a pillar having side walls and a base;

an $n^+$-doped source region extending along the base of the pillar, and an $n^+$-doped drain region disposed on the pillar;

the pillar having lateral dimensions chosen such that the pillar, in a potential-free state of the n-channel-EPROM cell, is fully depleted of free charge carriers;

an $n^+$-doped floating gate disposed on the side walls of the pillar and enclosing the pillar;

a control gate formed of $p^+$-doped semiconductor material, the control gate enclosing the pillar and the floating gate and being partly disposed on the side walls of the pillar; and an intermediate insulator layer between the control gate and the pillar.

In other words, the invention is characterized in that the pillars or cylinders which are fully depleted and the control gate is arranged directly on the pillar with an intermediate insulator layer at least in one subregion, and in that the control gate is formed from $p^+$-doped semiconductor material.

The fully depleted cylinders ensure a very good lower threshold behavior. As a result of the $p^+$-doped control gate, the threshold voltage of the transistor on the drain side is sufficiently high even with a small oxide thickness. This ensures reliable turn-off behavior. The threshold voltage in this case is somewhat more than 0.9 V. In the initial state, the floating gate transistor conducts since the threshold voltage for fully depleted NMOS with an $n^+$-doped floating gate assumes negative values because of the ionization energy. The EPROM cells can be programmed to more positive values by shifting the threshold voltage, by programming, preferably using hot charge carriers with a positive voltage on the drain. The extremely thin cylinders result in a very high integration density with a cell area of about $1.5*F^2$ being achieved if the etching masks for the cylinders are produced by an orthogonal spacer technique, as is described in my copending prior application Ser. No. 08/682,409, filed Jul. 17, 1996, which is herewith incorporated by reference.

In a preferred embodiment, the EPROM cells are designed as split gate flash cells. In the case of this technique, the control gate is separated from the fully depleted cylinder only by a thin insulator layer in one subarea. The invention also lends itself to using stacked gate flash cells.

The EPROM cells are preferably produced using silicon technology. The principle of the semiconductor memory according to the invention is, however, also conceivable using germanium or gallium-arsenide technology.

With the above and other objects in view there is also provided, in accordance with the invention, a method of producing such a high density integrated semiconductor memory. The method comprises the following steps:

a) producing etching masks on a $p^+$-doped substrate;

b) producing pillars in the substrate by anisotropic etching with the etching masks;

c) doping the etched-back areas of the substrate by $n^+$-implantation;

d) cleaning the pillars, and growing an oxide on the pillars and intermediate surfaces therebetween;

e) forming a floating gate by depositing $n^+$-doped polysilicon and removing, by anisotropic etching, the polysilicon in areas between the pillars;

f) depositing an interpolydielectric on the $n^+$-doped polysilicon;

g) depositing a planarizing medium and etching the planarizing medium back onto the lower pillar area;

h) isotropically etching the interpolydielectric and the first polysilicon layer above the planarizing medium;

i) growing a gate oxide on the etched-free areas;

j) depositing a $p^+$-doped polysilicon layer on the gate oxide and forming a control gate;

k) isotropically etching the second polysilicon layer so that the polysilicon layer deposited in step j) still completely encloses the first polysilicon layer; and removing the etching mask at tips of the pillars and producing contacts at the tips.

In other words, etching masks are first produced on a p-doped substrate wafer. Anisotropic etching is carried out with the etching masks in order to produce the pillars, $n^+$-implantation is carried out in the source areas, the pillars are cleaned and an oxide is grown on the pillars and on the intermediate surfaces. Next, $n^+$-doped polysilicon is deposited in order to form the floating gate and is removed in the area of the surfaces located between the pillars, by anisotropic etching.

An interpolydielectric is then deposited on the $n^+$-doped polysilicon, a planarizing medium is deposited and is etched back onto the lower pillar area, the interpolydielectric and the first polysilicon layer are etched isotropically above the planarizing medium, the planarizing medium is removed, a gate oxide is grown on the etched-free areas, a $p^+$-doped polysilicon layer is deposited thereon in order to form the control gate, the second polysilicon layer is anisotropically etched such that the second polysilicon layer still completely encloses the first polysilicon layer, and the original etching mask is removed at the pillar tips and the drain contacts are produced there.

In accordance with another feature of the invention, step a) comprises etching an auxiliary layer with two crossing spacer lines, whereby a grid formed by crossing areas of the spacer lines forms the etching mask. The distance between the parallel spacer lines is determined by the size F which can be achieved photolithographically. The width of the individual spacer lines is, however, determined only by the layer thickness used for the spacer layer and the spacer technique, and not by the structural resolution of the photographic technique. The crossing area of the spacer lines formed in this way can thus be produced to be smaller by a factor of virtually 4 than the structures which are produced directly photolithographically.

In accordance with again an additional feature of the invention, the doping in step c) is effected with a material of the main group V of the periodic table of elements, and preferably with arsenic. The side wall polymers which are produced before the doping during the etching of the pillars and also mask the implantation are etched isotropically in a favorable manner after the implantation. The side wall polymers, which are produced as a by-product during the etching, can thus ensure a cleaner production process the same time as an implantation mask.

In accordance with a further feature of the invention, the interpolydielectric of step f) is ONO which is produced or deposited by oxidation onto the first, $n^+$-doped polysilicon layer, which forms the floating gate. Furthermore, varnish is preferably used as the planarizing medium (step g), since this can easily be applied and etched back, and can be removed selectively with respect to the other materials.

In accordance with a particularly preferred feature of the invention, the pillars are produced at a shorter distance apart from one another in the word line direction than in the bit line direction. In this case, it is particularly favorable to etch the second polysilicon layer, which forms the control gate, back so far that there is a connection between the control gates of the individual pillars or cells in the word line direction, but not in the bit line direction. This results in the production of a self-aligned word line.

Other features which are considered as characteristic for the invention are set forth in the appended claims.

Although the invention is illustrated and described herein as embodied in high density integrated semiconductor memory and method for production of the semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
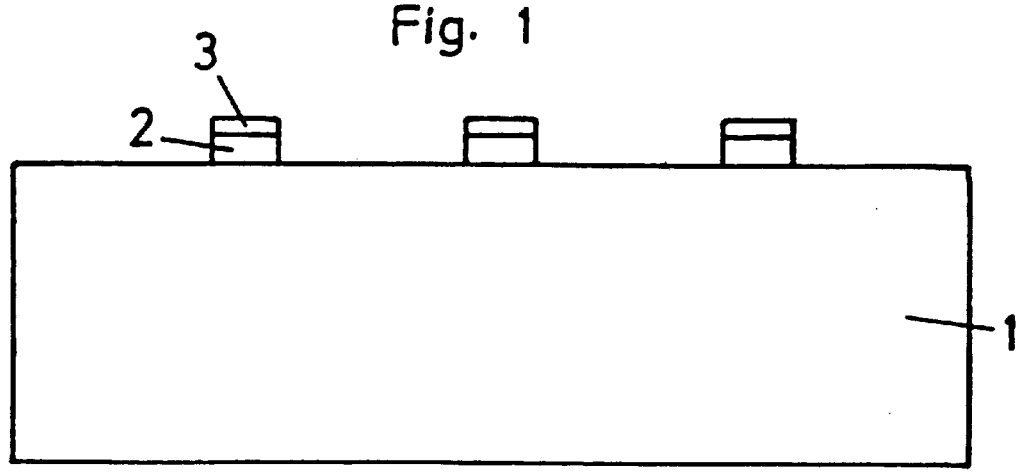
FIGS. 1 to 7 are schematic cross-sectional views illustrating various stages in the method sequence, the sections taken along the bit line direction.

Referring now to the figures of the drawing in detail and first, particularly, to FIG. 1 thereof, there is seen a $p^+$-doped substrate 1, which forms a part of a wafer. Sub-lithographic etching masks are produced on the flat substrate wafer by application of an oxide layer and an auxiliary polysilicon layer over it. An etching mask 2 is produced with the aid of crossing spacer lines. The structural size of the etching mask 2 is determined only by the deposited layer thickness and the spacer technique. The illustrated etching masks 2, with the thin residual layer of amorphous silicon or polysilicon 3 still located over them, are produced in this way. The oxide etching masks are either thermally oxidized or are produced by TEOS deposition. It is also possible to use nitride.

Figure 2:
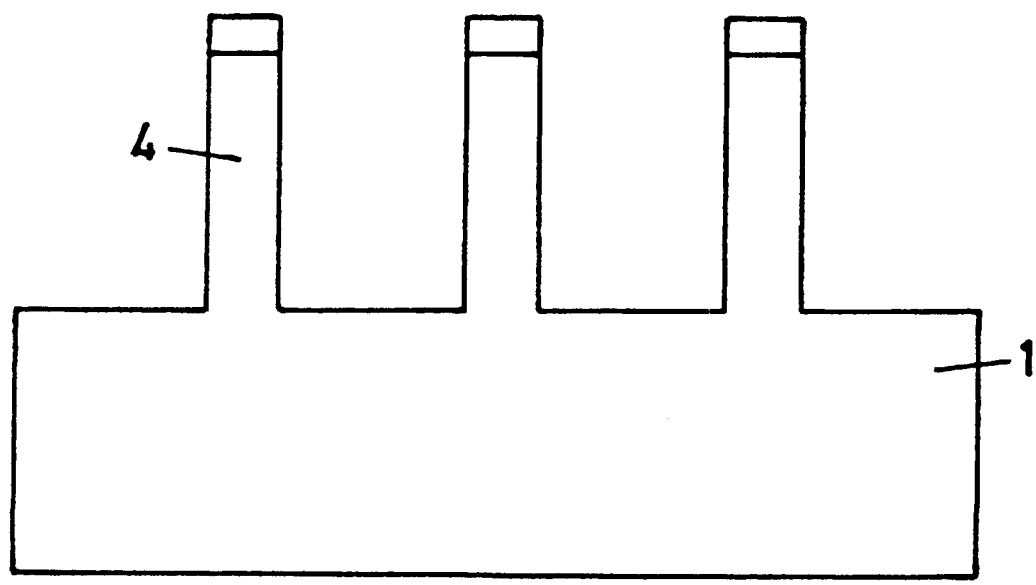

FIG. 2 illustrates how the substrate 1 is anisotropically etched using the etching mask 2, so that the pillars 4 are produced.

Figure 3:
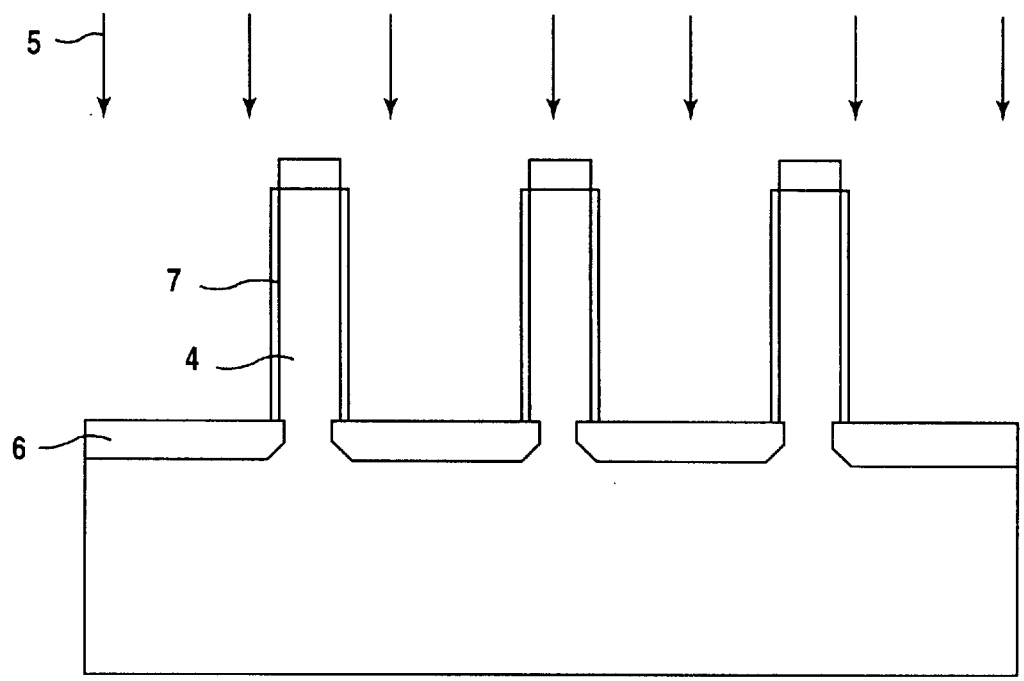

Referring now to FIG. 3, arrows 5 symbolize the common source implantation into the back-etched substrate areas. The substrate areas which are n+-doped with arsenic As are indicated at the reference numeral 6. Polymers produced on the side walls of the pillars 4 during reactive ion etching form a protective layer 7 on the pillars. The layer 7 prevents implantation into the pillars. After the implantation, the polymers of the protective layer 7 are removed and the silicon is etched over isotropically in order to produce clean surfaces on the side walls of pillars 4.

Figure 4:
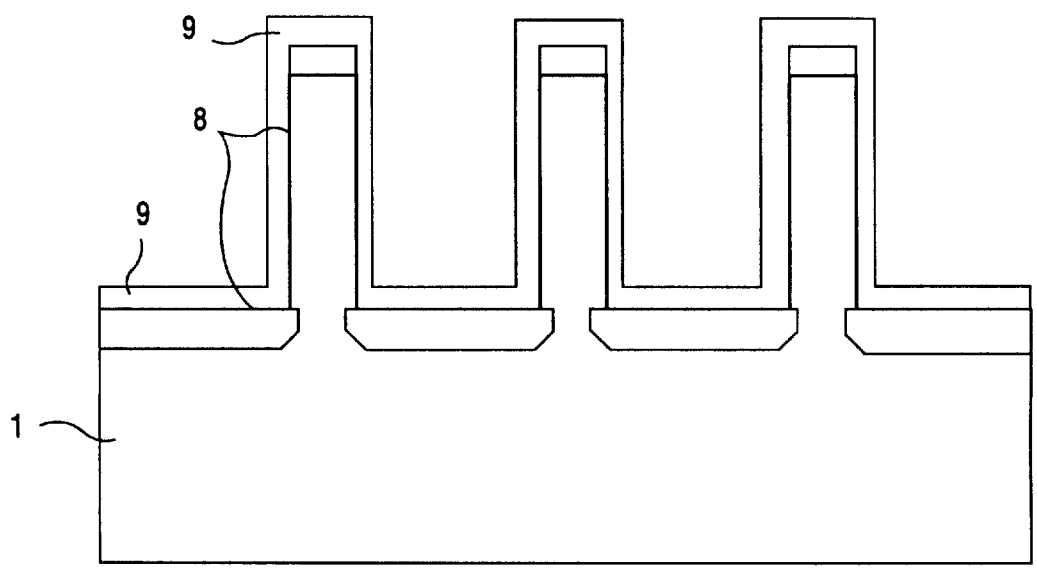

With reference to FIG. 4, a tunnel oxide 8 is applied onto the pillars 4 which have been cleaned in this way, preferably by growth. A layer of n+-doped polysilicon is deposited. The polysilicon layer 9 will form the floating gate.

Figure 5:
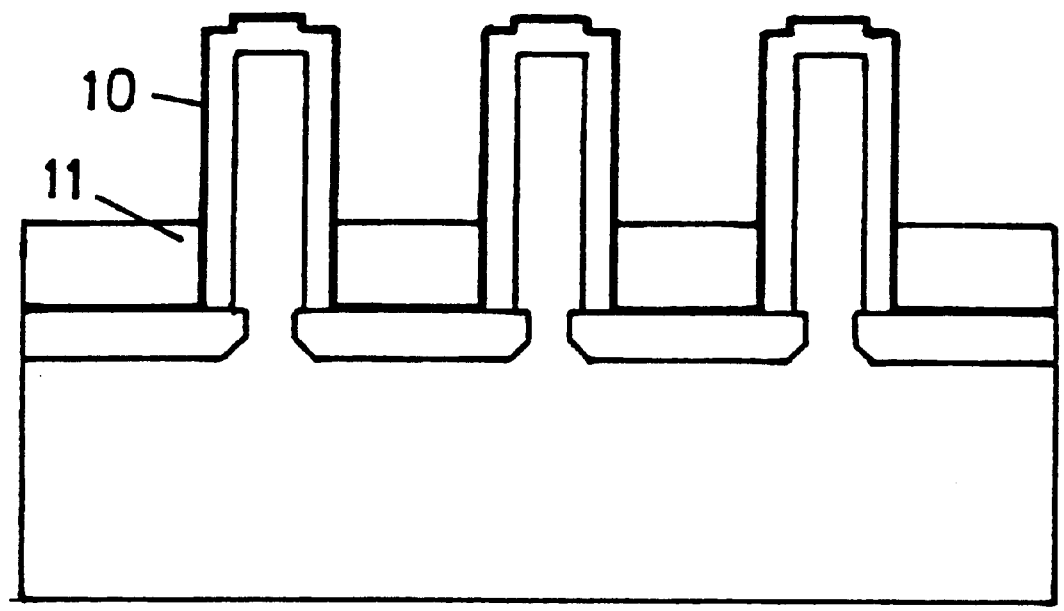

The subsequent method steps are explained with reference to the illustration in FIG. 5. First, the polysilicon layer 9 is etched on the etched-back substrate areas in an anisotropic selective etching process. At the same time, the part of the polysilicon layer on the tips of the pillars 4 is also removed and rounded regions or bulges are produced at the corners of the pillar tips. An interpolydielectric 10 is then produced by oxidation or deposition. ONO is preferably used for this purpose. A planarizing medium 11, in particular varnish, is deposited thereon and is etched back so far that the lower area of the pillar 4 is covered.

Figure 6:
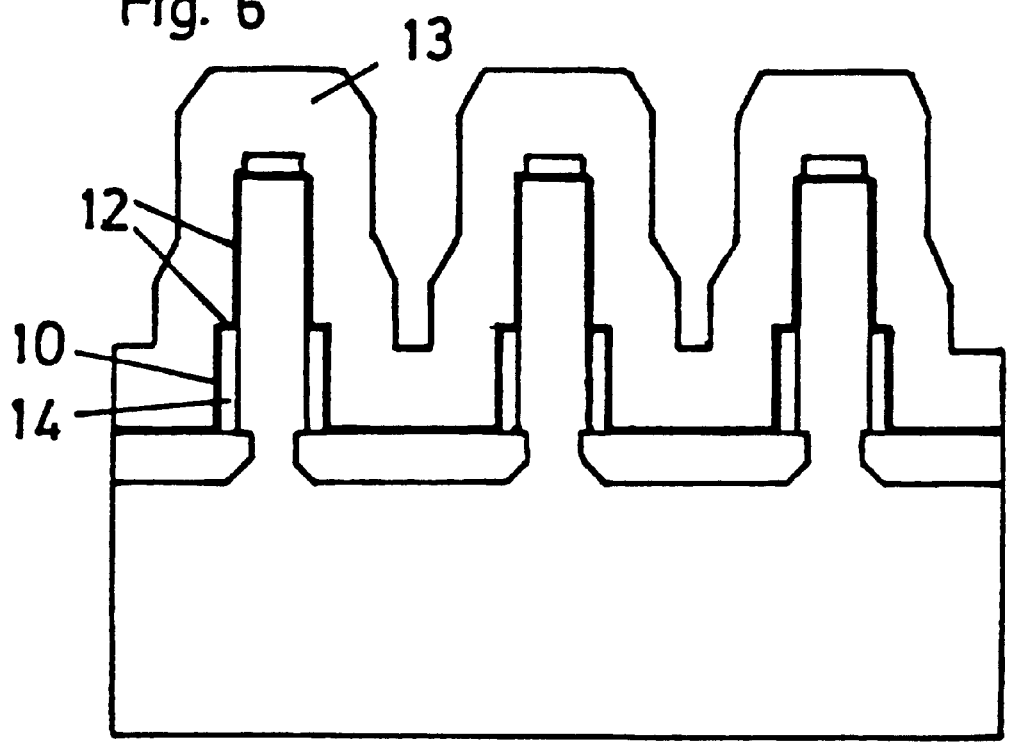

The sandwich formed by the interpolydielectric 10 and the n+-doped polysilicon layer 9 is etched back isotropically above the planarizing medium 11, preferably by plasma etching, down to the pillar 4. The planarizing medium 11 is then completely removed, and a gate oxide 12 of the series transistor of the split gate cell is grown thermally. An n+-doped ring of the first polysilicon layer 9 is thus left behind in the lower area of the pillars 4, and forms the floating gate 14. A second polysilicon layer 13, which is p+-doped, is deposited onto the gate oxide 12 and the remaining interpolydielectric layer 10. The second silicon layer 13 is used to form the control gate. The resulting structure is illustrated in FIG. 6.

Figure 7:
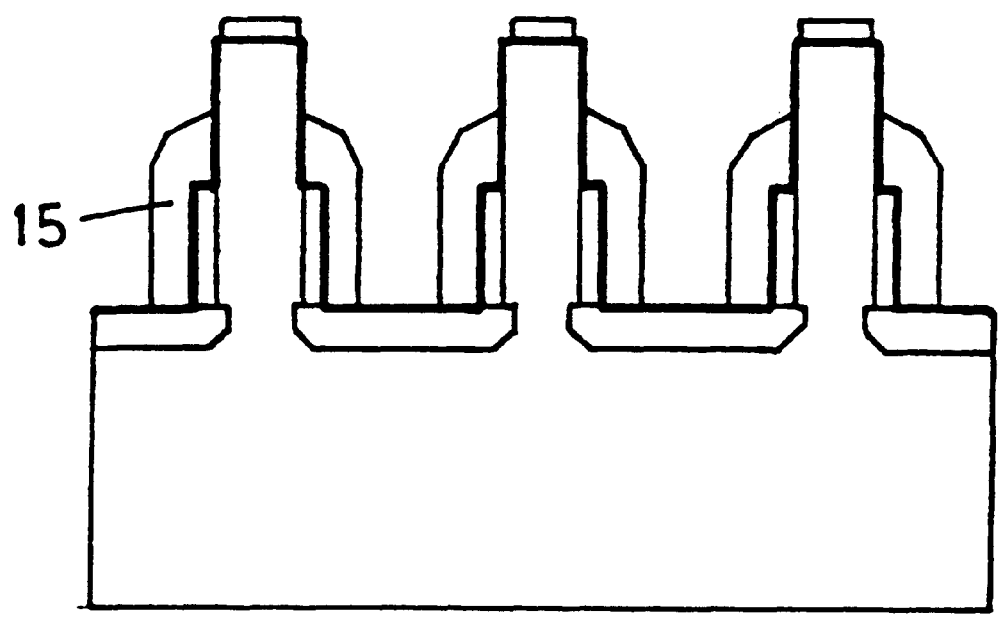
Figure 8:
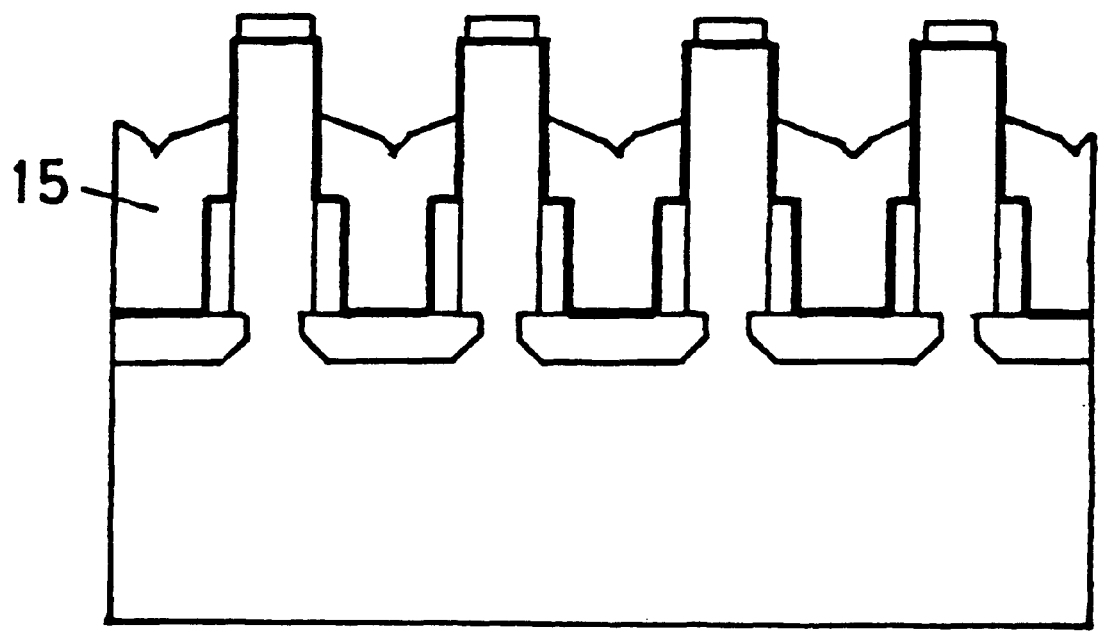
FIG. 8 is a sectional view illustrating the processing stage of FIG. 7, taken along the word line direction.

With reference to FIGS. 7 and 8, the second polysilicon layer 13 is etched anisotropically so that a second spacer ring is produced which completely encloses the first spacer ring. The second spacer ring forms the control gate 15 of the split gate flash EPROM cell, which completely encloses the floating gate 14. The thickness of the second polysilicon layer 13 is selected such that it is etched back down to the etched-back substrate base, in one direction, during the anisotropic etching. This is shown in FIG. 7. FIG. 8 is a section perpendicular to FIG. 7. In that direction, the pillars 4 are somewhat closer to one another, so that the control gates each have an overlap with the control gate 15 of the adjacent cell. A self-aligned word line (self-aligned control gate) is thus produced in this direction.

Figure 9:
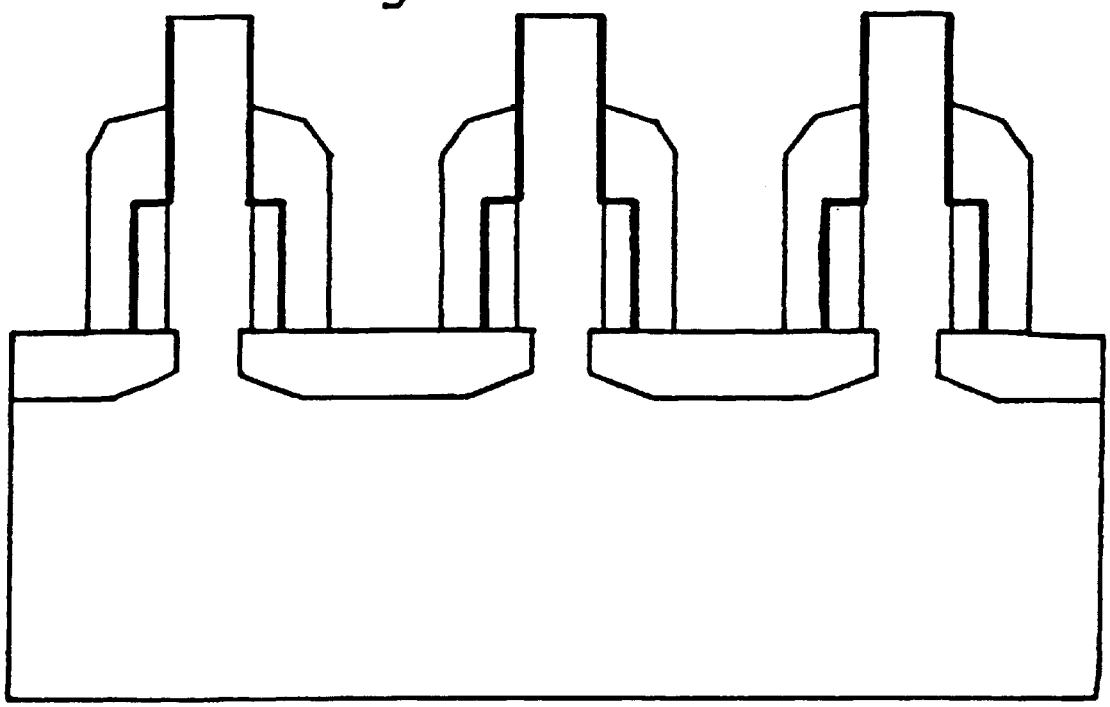
FIGS. 9 and 10 are schematic cross-sectional views of further processing stages, taken along the bit line direction.

With reference to FIG. 9, the original etching mask 2 (see FIG. 1) is removed in the ensuing step.

Figure 10:
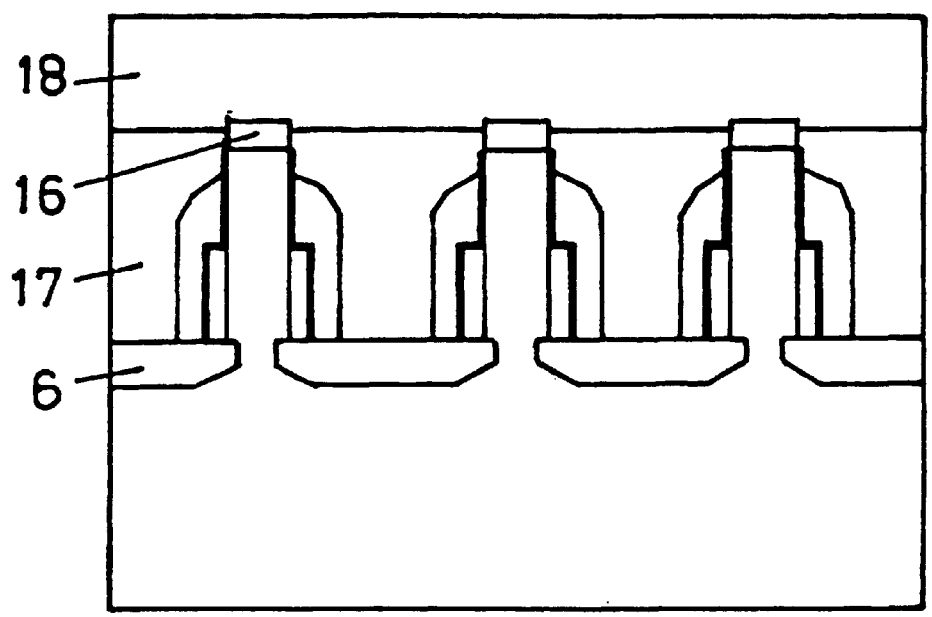

With reference to FIG. 10, the sequence continues by n+-doping the remaining tip of the pillar 4. The n+-doped area is designated by the reference symbol 16. The pillar tip is used to form the drain connection and is doped with the same conductivity as the source connection in the also n+-doped substrate areas 6. However, a planarizing oxide 17 is applied before the implantation in the upper pillar areas 16, and is etched back as far as the upper boundary of the pillars 4. A TEOS layer having a suitable thickness can likewise be deposited, and etched back by CMP (Chemical-Mechanical Polishing). The areas 16 are not implanted until this has been done, since the gate areas located underneath are in this way protected by the planarizing oxide 17. Still with reference to FIG. 10, the drain contacts are connected by means of a metal interconnect 18. The metal interconnect is continuous in the direction of the bit line.

Figure 11:
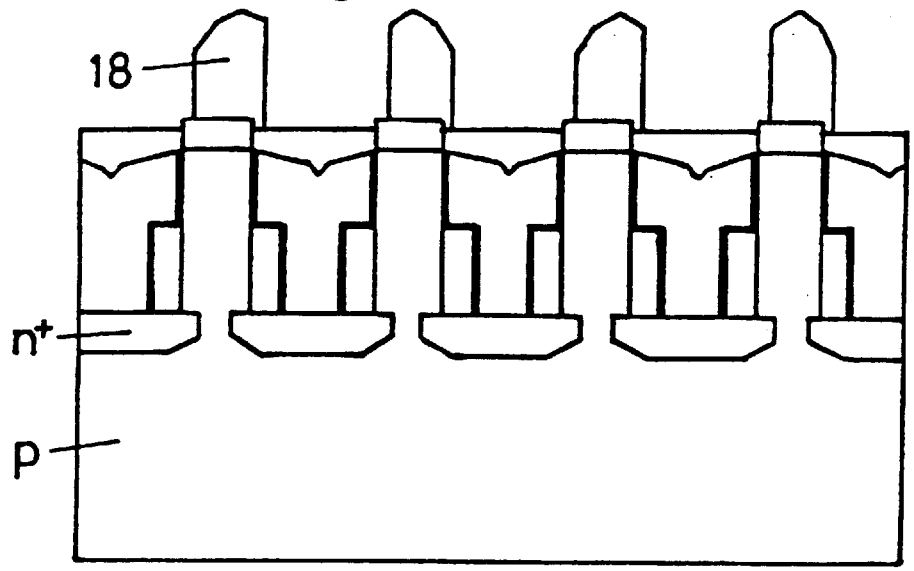
FIG. 11 is a longitudinal section along the word line direction corresponding to the stage of FIG. 10.

FIG. 11 corresponds to the method state in FIG. 10, but illustrates a section in the word line direction. The metal interconnects 18 are thus formed only along the bit line direction. If the etching masks of the pillars have been produced by the spacer technique, the metal interconnects 18 are also produced by the spacer technique, for example by chemical vapor deposition of tungsten on an oxide auxiliary layer.

Figure 12:
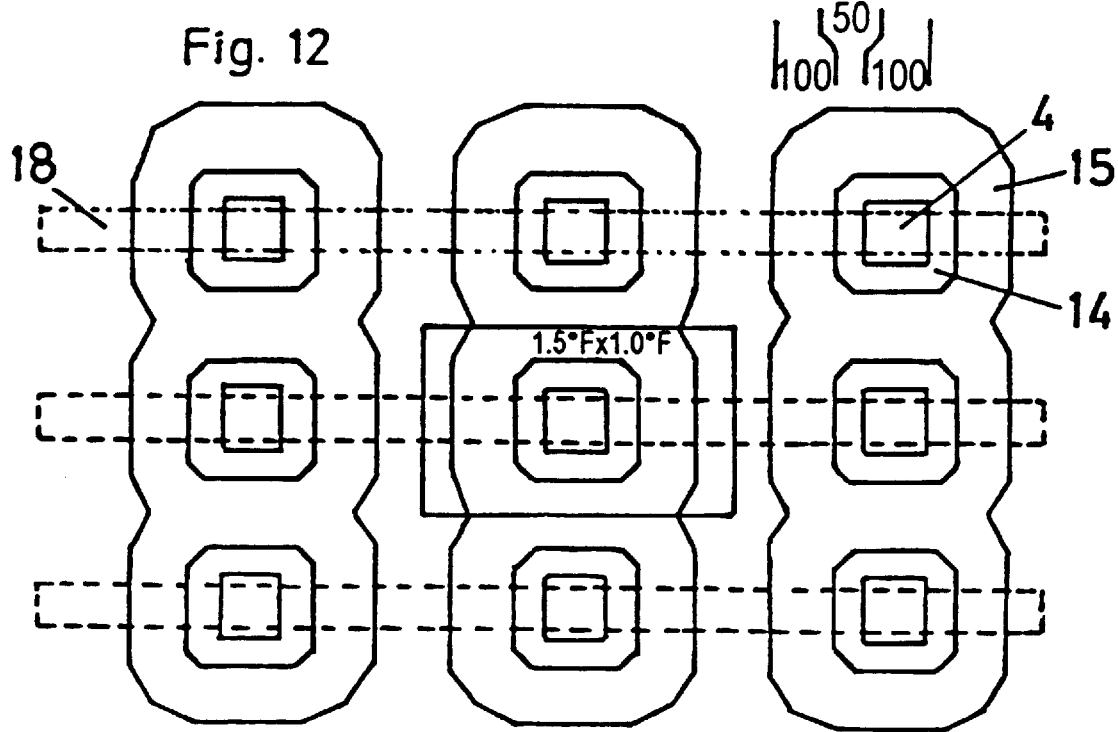
FIG. 12 is a schematic plan view onto the periodic memory cell field.

The plan view of FIG. 12 illustrates a horizontal section through a periodic memory cell field which has been produced in such a way. The pillars 4 are illustrated with the floating gate 14 surrounding them, and with the control gate 15 which is formed around them. The control gates 15 form an overlap in the word line direction, so that a self-aligned word line is formed. The control gates 15 are separated from one another in the bit line direction, but there is a connection by the metal interconnects 18, which are indicated by dashed lines. A memory cell has a size of about 1.0 F in the direction of the word line, and 1.5 F in the direction of the bit line.

With respect to their functionality, the individual memory cells correspond to conventional split gate flash cells. The fully depleted pillars allow a very good lower threshold behavior to be expected. As a result of the p+-doped control gate, the threshold voltage of the split gate transistor on the drain side is sufficiently high, even with a small oxide thickness.

I claim:

1. A highly integrated semiconductor memory, comprising:

an n-channel-EPROM cell in the form of a pillar having side walls and a base;

an n+-doped source region extending along said base of said pillar, and an n+-doped drain region disposed on said pillar;

said pillar having lateral dimensions chosen such that said pillar, in a potential-free state of the n-channel-EPROM cell, is fully depleted of free charge carriers;

an n+-doped floating gate disposed on said side walls of said pillar and enclosing said pillar;

a control gate formed of p+-doped semiconductor material, said control gate enclosing said pillar and said floating gate and being partly disposed on said side walls of said pillar; and an intermediate insulator layer between said control gate and said pillar.

2. The semiconductor memory according to claim 1, wherein said n-channel-EPROM cell is a silicon-type EPROM cell.

* * * * *